(12) United States Patent
Chengson

(10) Patent No.: US 8,508,248 B1
(45) Date of Patent: Aug. 13, 2013

(54) TESTING VIAS FORMED IN PRINTED CIRCUIT BOARDS

(75) Inventor: David P. Chengson, Aptos, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 366 days.

(21) Appl. No.: 13/024,408

(22) Filed: Feb. 10, 2011

(51) Int. Cl.
*G01R 31/309* (2006.01)

(52) U.S. Cl.
USPC .......... 324/763.01; 324/533; 702/119

(58) Field of Classification Search
USPC ............ 324/533, 637–646, 756.07, 757.02, 324/763.01
See application file for complete search history.

(56) References Cited

U.S. PATENT DOCUMENTS

| | | | | |
|---|---|---|---|---|
| 6,512,377 B1 * | 1/2003 | Deng et al. | .......... | 324/533 |
| 8,332,177 B2 * | 12/2012 | Liang et al. | .......... | 702/119 |

OTHER PUBLICATIONS

Miller & Miller, Electronics: The Easy Way, 2002, Barron's Educational Series Inc., p. 448.*
Buli Xu, Yinchao Chen, Tom McDonough, and Hao Li, Impact of Differential Vias on High-Speed Connection Design, 2009, IEEE, Section III.*

* cited by examiner

*Primary Examiner* — Patrick Assouad
*Assistant Examiner* — Sean Curtis
(74) *Attorney, Agent, or Firm* — Harrity & Harrity, LLP

(57) ABSTRACT

A device provides a time domain reflectometry (TDR) or a vector network analyzer (VNA) test signal to a via test area provided on a printed circuit board (PCB), where the via test area includes vias and via stubs formed in the vias. The device also receives a reflected signal from each via in the via test area of the PCB, and compares the reflected signal from each via to a minimum impedance threshold. The device further provides, for display, an indication of passing for the PCB, when the reflected signals from the vias are greater than the minimum impedance threshold.

20 Claims, 10 Drawing Sheets

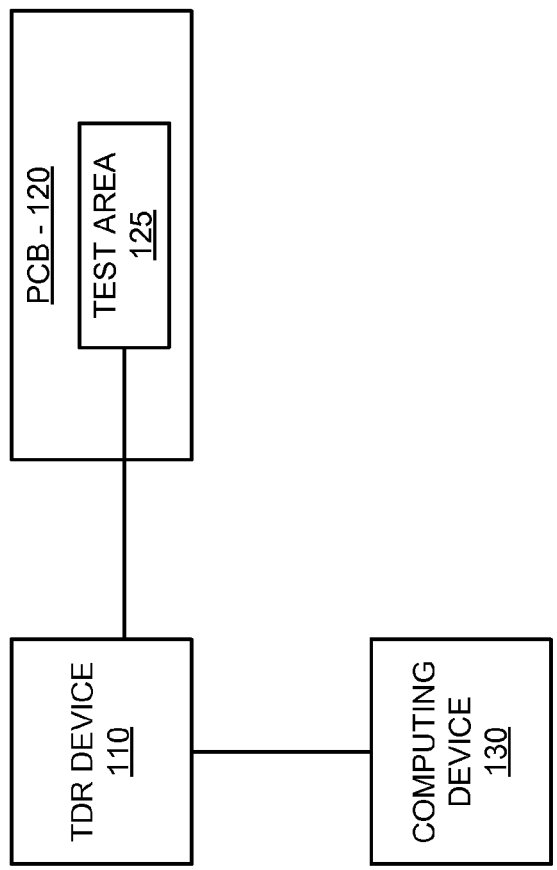

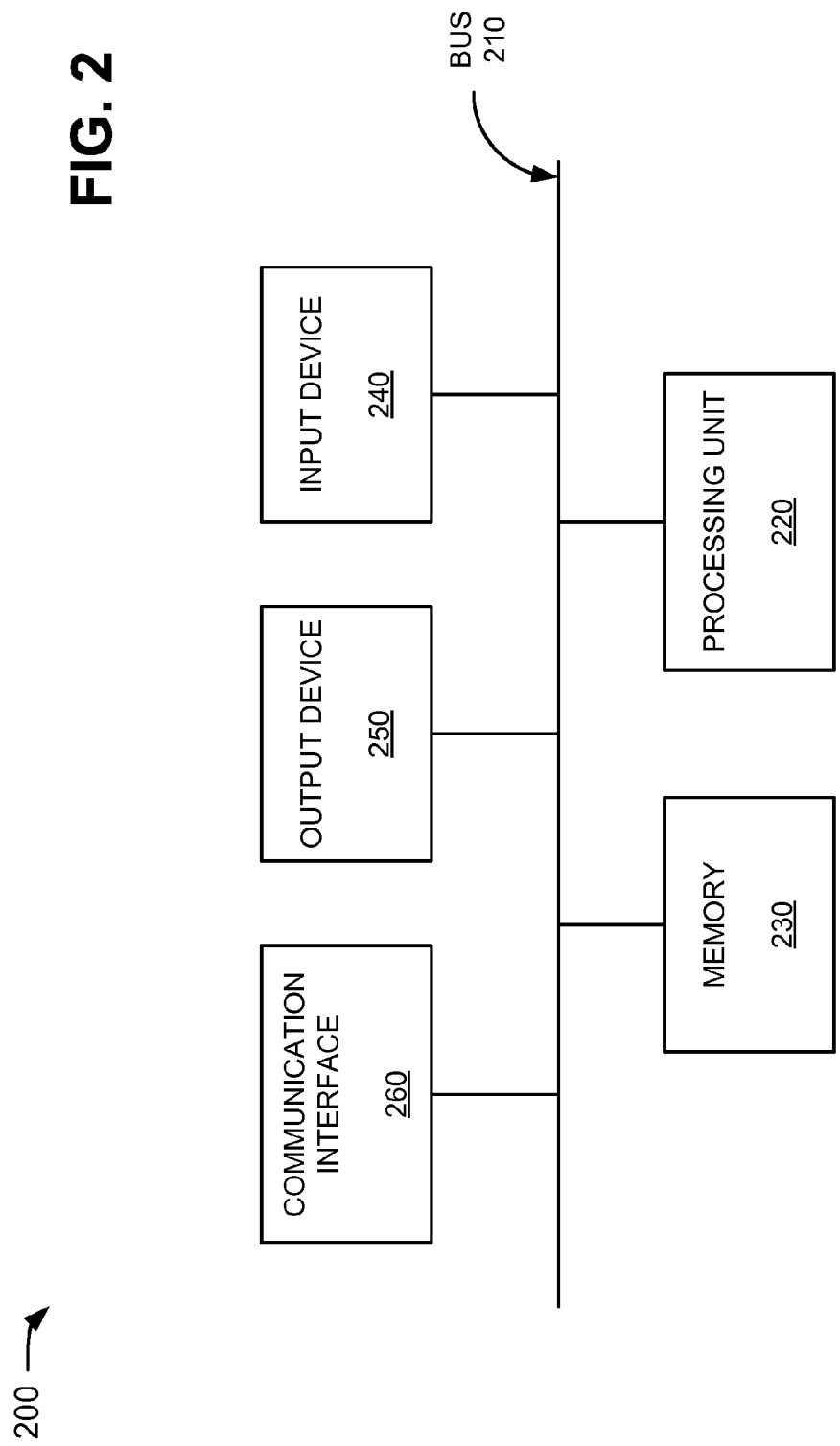

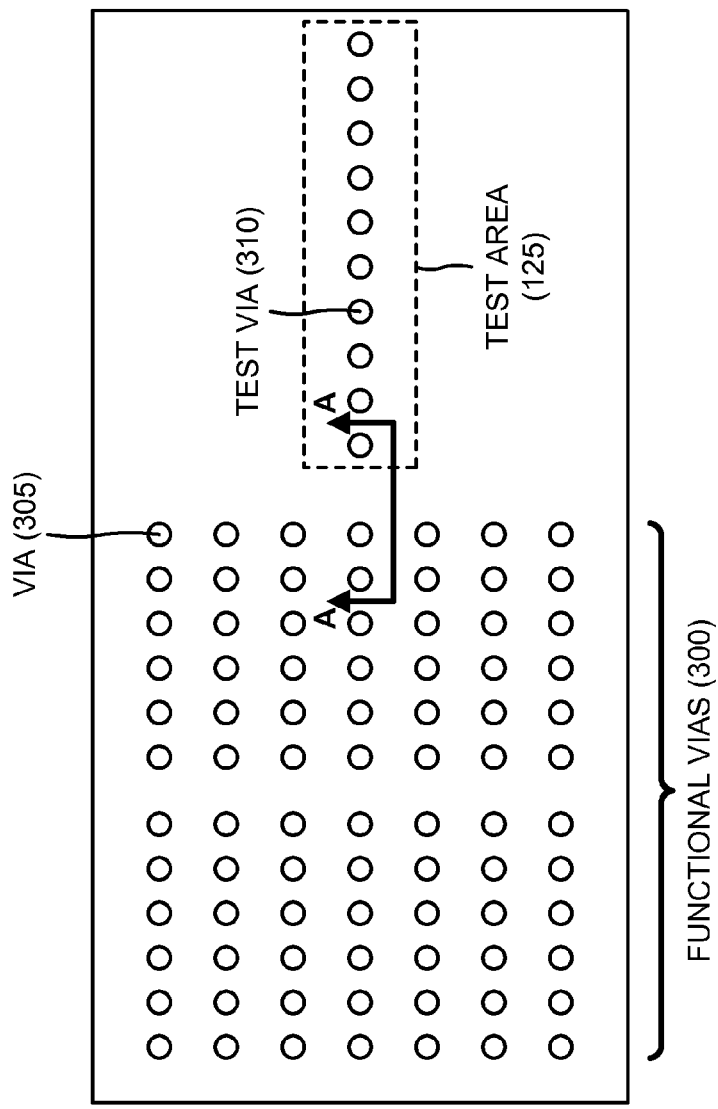

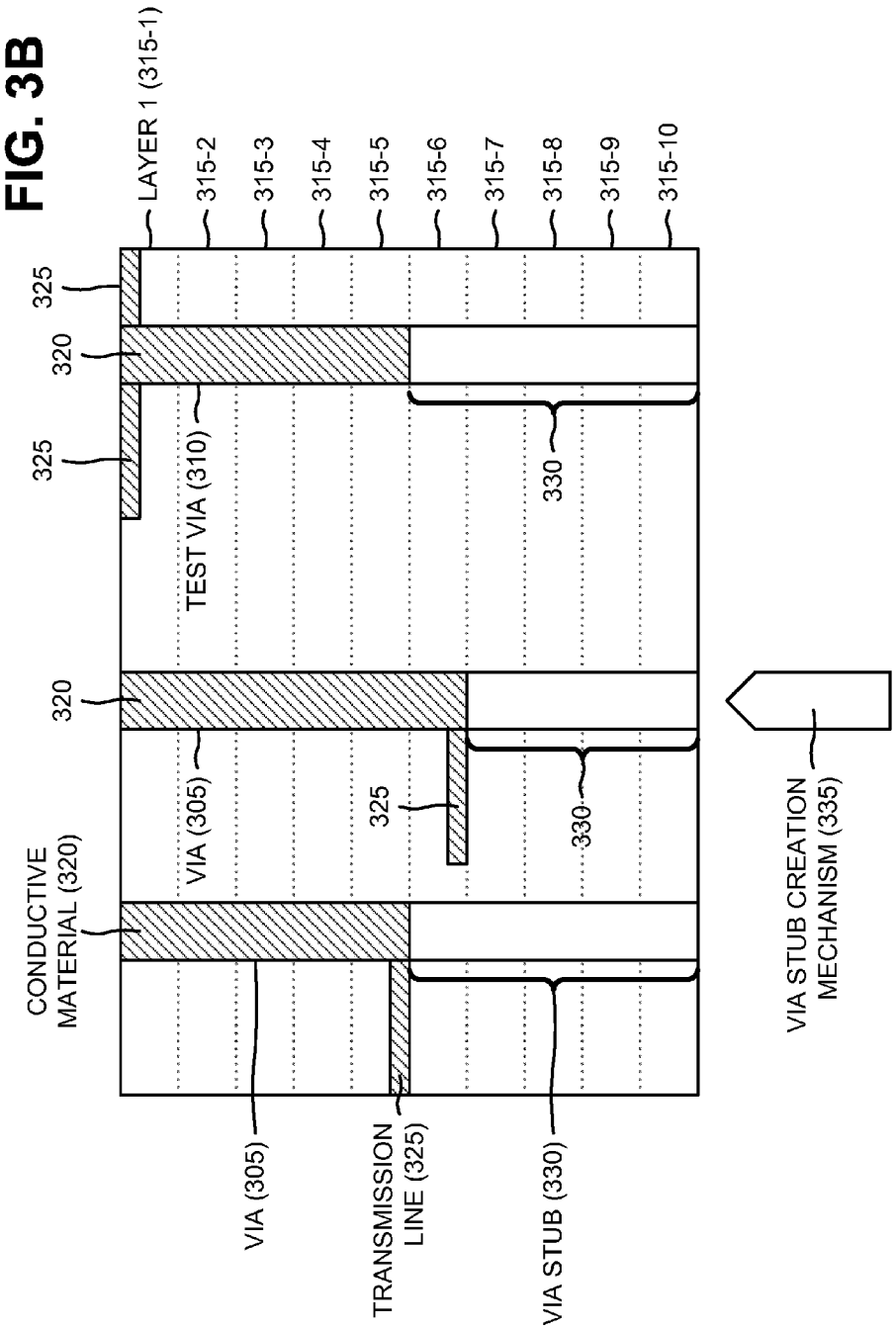

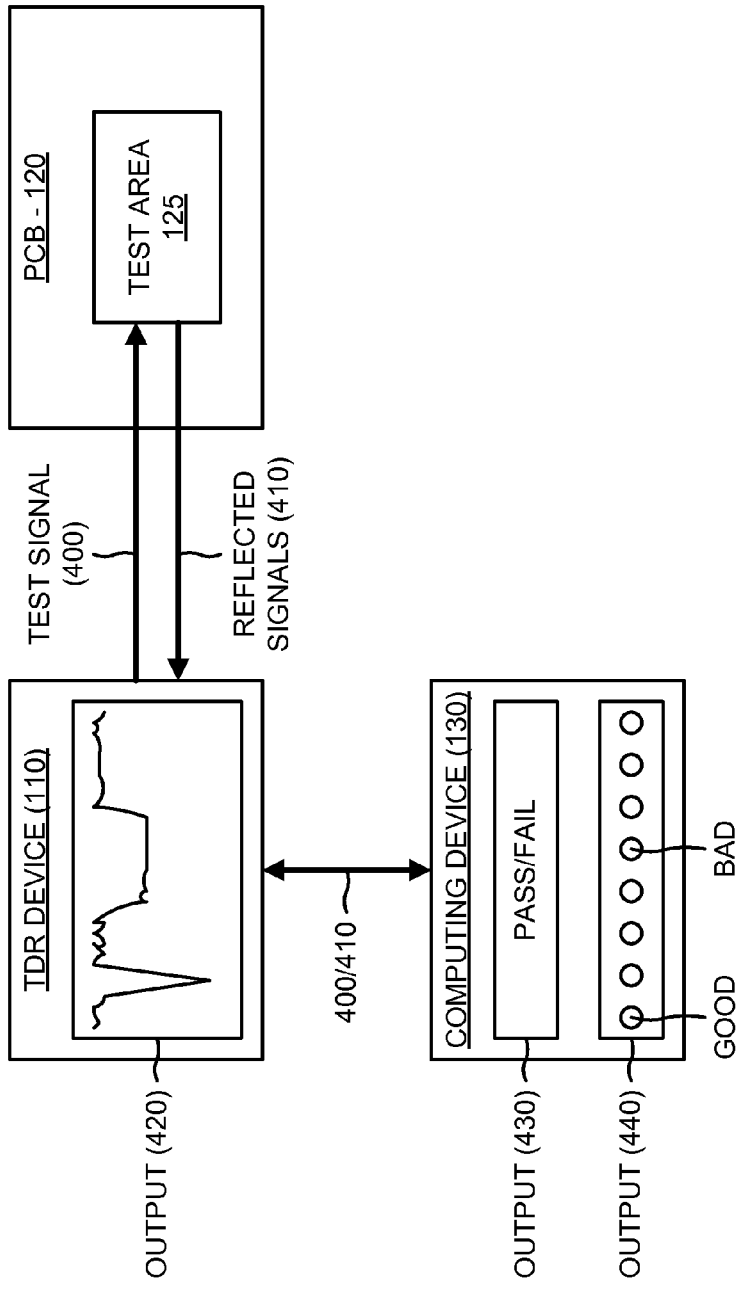

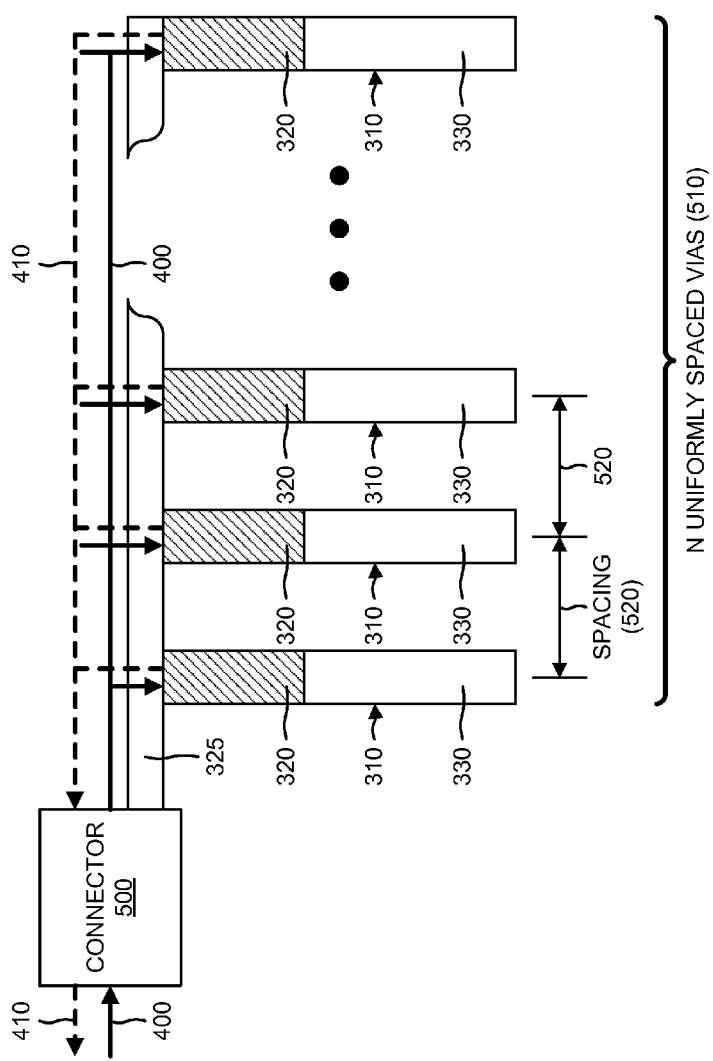

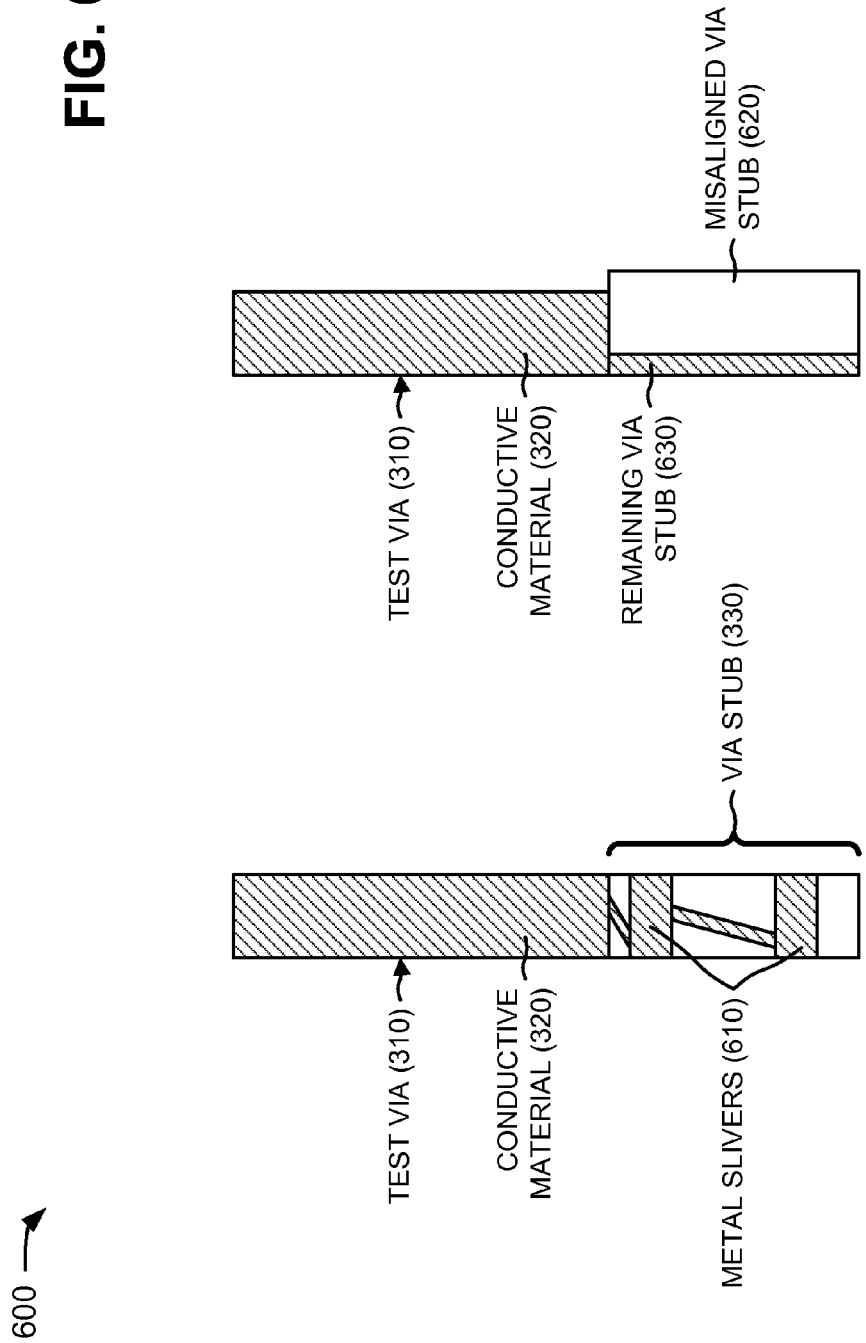

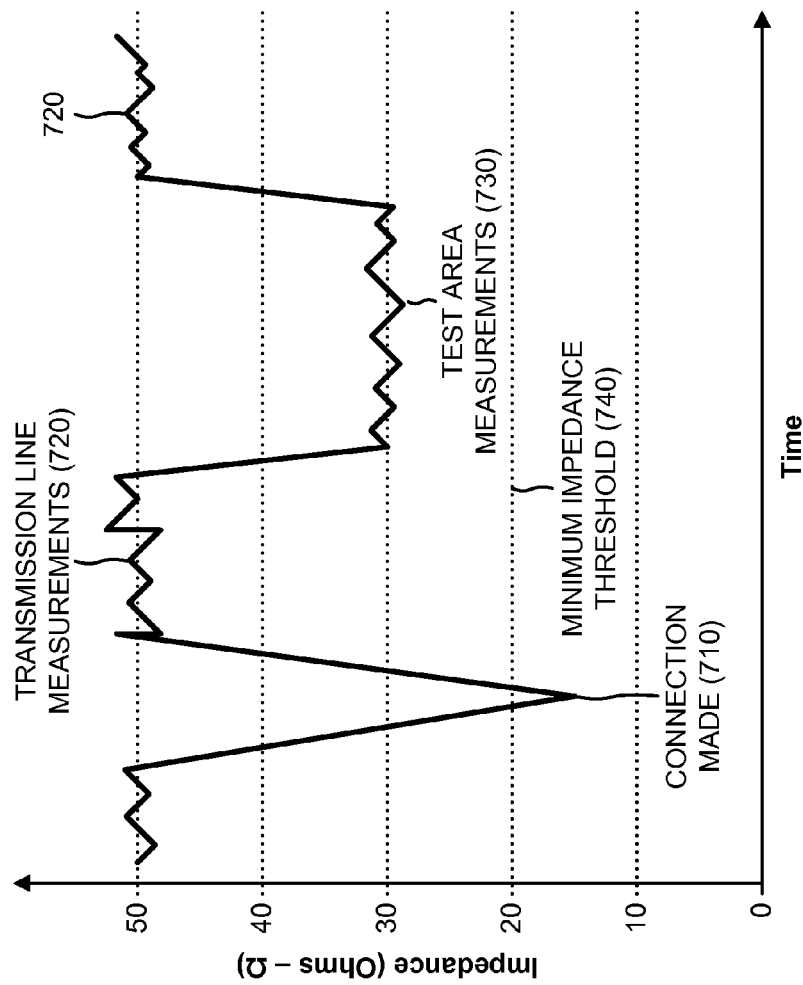

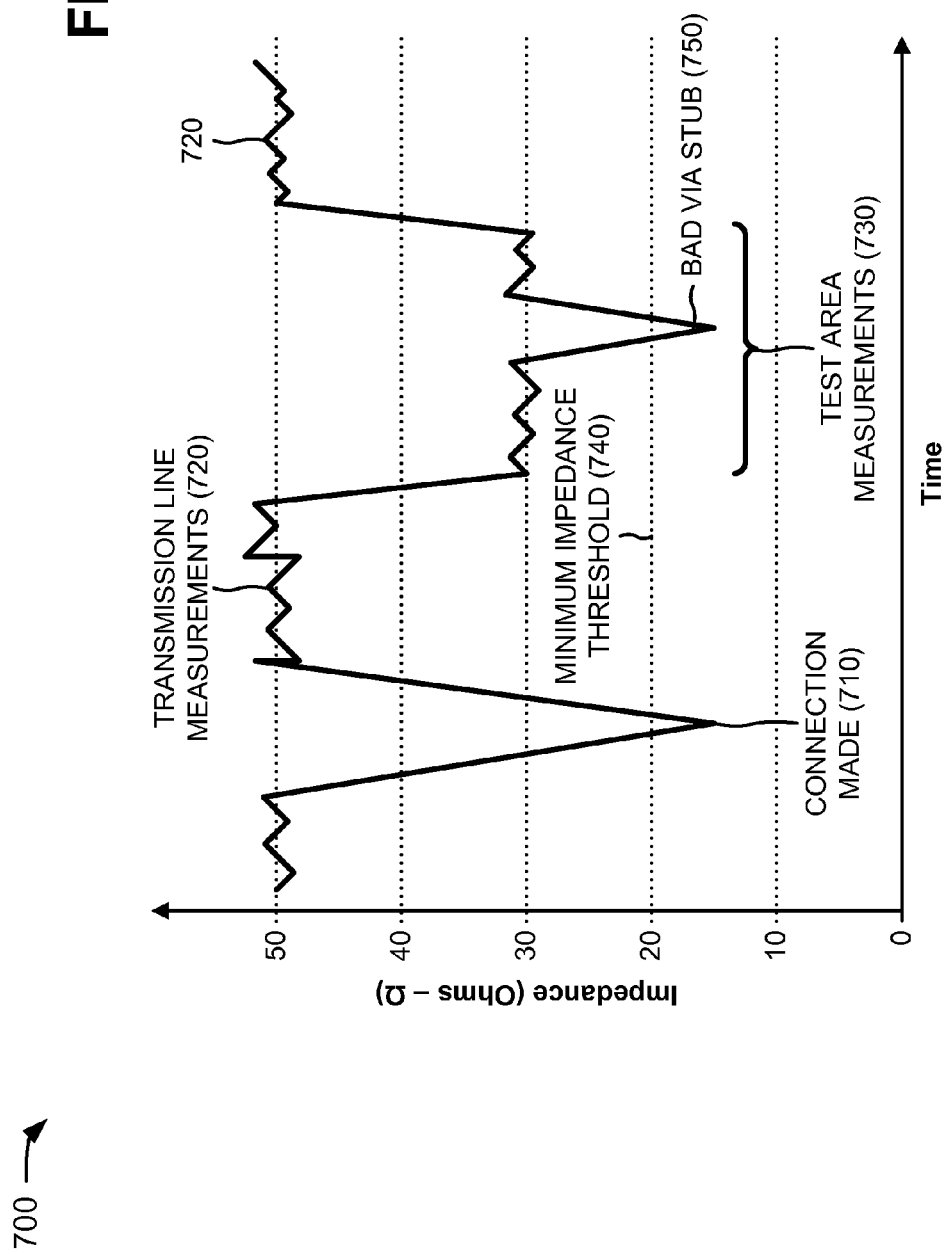

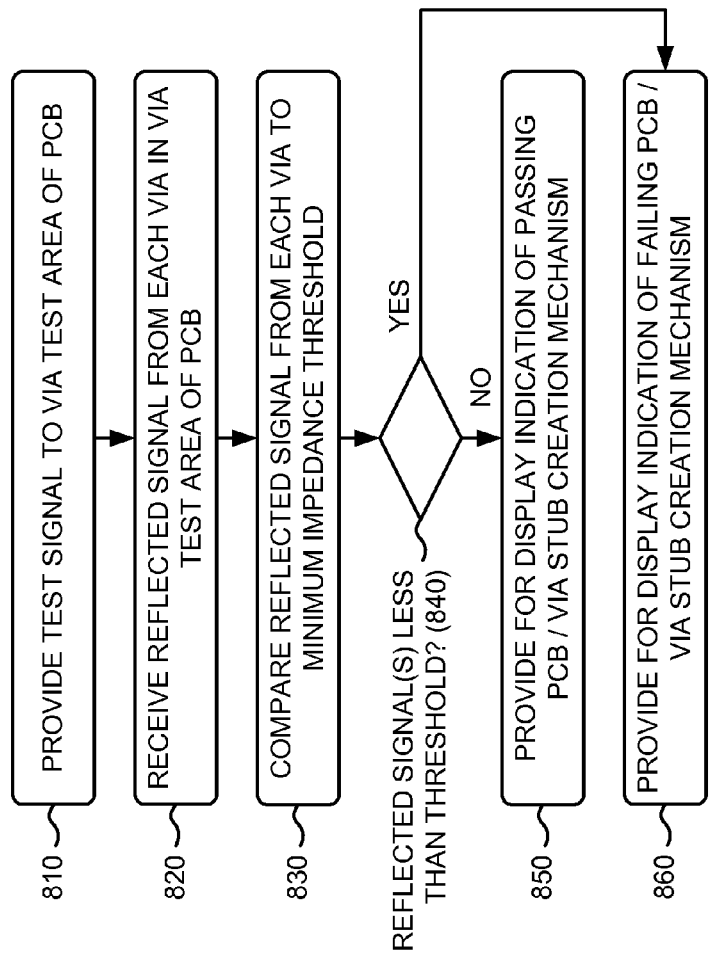

TESTING VIAS FORMED IN PRINTED CIRCUIT BOARDS

BACKGROUND

Printed circuit boards (PCBs) (which may be referred to as printing wiring boards (PWBs) or etched wiring board assemblies) may be used in computers, communications devices (e.g., pagers, personal digital assistants (PDAs), telephones, etc.), routers, televisions, cameras, and/or many other devices. A typical PCB includes multiple layers, and many electrical components may be attached to the top and/or bottom surfaces of each of the multiple layers. PCBs may be used to mechanically support and electrically connect the many electrical components using conductive pathways, or traces, which may be etched from copper sheets laminated onto a non-conductive substrate. Electrical components on different layers of the PCB may interconnect through provision of vertical interconnect access "vias" (or holes) that may extend from a top surface of the PCB to a bottom surface of the PCB. Conductive material (e.g., metal) may be provided in the vias to electrically interconnect the electrical components on different layers of the PCB.

Some of the vias provided in a PCB may not need to interconnect all of the layers of the PCB. Thus, some of the conductive material provided in such vias may be removed (e.g., to create what is referred to as "via stubs") using a variety of removal techniques. For example, the conductive material may be removed using mechanical removal techniques (e.g., back drilling or front drilling), optical removal techniques (e.g., laser drilling), or chemical removal techniques (e.g., etching). However, the removal techniques may not effectively remove all of the conductive material from the particular PCB vias, which may result in improper functioning or complete inoperability of the PCB.

For example, back (or front) drilling of PCB vias (e.g., to remove conductive material) can experience quality problems due to drill bit wear. The worn drill bit may only partially remove the conductive material from the PCB via stub, which may create yield problems for high-speed PCB applications. With increased usage, an outer diameter of the drill bit becomes smaller and less sharp. As the drill bit ages, the back (or front) drilling of the via sometimes does not remove all of the conductive material from the via stub. The remaining conductive material may create unwanted electrical connections in the PCB. As data speeds associated with PCBs increase (e.g., to ten and twenty-five gigabits per second (Gbps)), problems associated insufficient via removal techniques become even more prevalent.

One proposed solution to insufficient via removal is to manually inspect each of the via stubs. However, manually inspecting via stubs for such problems is ineffective due to the large number of via stubs provided in PCBs and the potential for manual error. Another solution is to accept the yield loss after electrical component assembly of a problem PCB. However, such a solution may be costly to manufacturers of the PCB, manufacturers of devices that utilize the PCB, and/or the ultimate consumer.

SUMMARY

According to one aspect, a method may be implemented by a device. The method may include providing, by the device, a time domain reflectometry (TDR) or a vector network analyzer (VNA) test signal to a via test area provided on a printed circuit board (PCB); receiving, by the device, a reflected signal from each via in the via test area of the PCB; comparing, by the device, the reflected signal from each via to a minimum impedance threshold; and providing, by the device and for display, an indication of passing for the PCB, when the reflected signals from the vias are greater than the minimum impedance threshold.

According to another aspect, a device may include a memory to store a plurality of instructions, and a processor to execute instructions in the memory to provide a time domain reflectometry (TDR) or a vector network analyzer (VNA) test signal to a via test area provided on a printed circuit board (PCB), where the via test area includes vias and via stubs formed in the vias. The processor may further execute instructions in the memory to receive a reflected signal from each via in the via test area of the PCB, compare the reflected signal from each via to a minimum impedance threshold, and provide, for display, an indication of passing for the PCB, when the reflected signals from the vias are greater than the minimum impedance threshold.

According to still another aspect, one or more non-transitory computer-readable media may store instructions executable by one or more processors. The media may store one or more instructions for: providing a time domain reflectometry (TDR) or a vector network analyzer (VNA) test signal to a via test area provided on a printed circuit board (PCB); receiving a reflected signal from each via in the via test area of the PCB; comparing the reflected signal from each via to a minimum impedance threshold; providing, for display, an indication of passing for the PCB or for a mechanism used to create via stubs for the vias, when the reflected signals from the vias are greater than the minimum impedance threshold; and providing, for display, an indication of failing for the PCB or for the mechanism used to create via stubs for the vias, when at least one of the reflected signals from the vias is less than the minimum impedance threshold.

BRIEF DESCRIPTION OF THE DRAWINGS

The accompanying drawings, which are incorporated in and constitute a part of this specification, illustrate one or more implementations described herein and, together with the description, explain these implementations. In the drawings:

FIG. 1 is a diagram of an example environment in which systems and/or methods described herein may be implemented;

FIG. 2 is a diagram of example components of one of the devices depicted in FIG. 1;

FIG. 3A is a diagram of example components of a PCB, and its associated test area, depicted in FIG. 1;

FIG. 3B is a partial cross-sectional view, taken along line A-A of FIG. 3A, of the PCB;

FIG. 4 is a diagram of example operations capable of being performed by the network depicted in FIG. 1;

FIG. 5 is a diagram of example components of the test area of the PCB illustrated in FIG. 1;

FIG. 6 is a diagram showing example problems that may occur due to improper removal of conductive material from vias of the PCB depicted in FIG. 1;

FIG. 7A is a diagram of example measurement results associated with a properly formed test area of the PCB illustrated in FIG. 1;

FIG. 7B is a diagram of example measurement results associated with an improperly formed test area of the PCB illustrated in FIG. 1; and FIG. 8 is a flow chart of an example process for testing vias formed in printed circuit boards according to implementations described herein.

DETAILED DESCRIPTION

The following detailed description refers to the accompanying drawings. The same reference numbers in different drawings may identify the same or similar elements.

Systems and/or methods described herein may provide a test area (e.g., of vias and via stubs) on a PCB (e.g., on a PCB panel or a side of the PCB) that enables an electrical test of the PCB vias/via stubs. The systems and/or methods may be more effective than manual inspection of via stubs, and may prevent costly yield losses of PCBs. In one example implementation, a time domain reflectometry (TDR) measurement (e.g., a measurement technique used to determine characteristics of electrical lines by observing reflected waveforms) of the test area may be performed. The TDR measurement may show whether conductive material is effectively removed from the vias to create the via stubs in the PCB. If the conductive material is effectively removed, the TDR measurement results may show a constant impedance (or a small impedance depression depending upon layers of the PCB) versus length (i.e., a passing criteria for the PCB). If the conductive material is not effectively removed, the TDR measurement results may show a significant impedance depression that is below a minimum impedance threshold (e.g., a passing impedance tolerance).

The test area may include a number of uniformly spaced vias/via stubs provided along a controlled impedance transmission line (or trace). In one example implementation, the test area vias/via stubs may be spaced a distance in a range of about one (1) millimeter (mm) to about "250" mm, depending on the overall thickness of the PCB and edge rate of the TDR device. If the spacing is too small between the test area vias/via stubs, adjacent vias/via stubs may contact one another. If the spacing is too large between the test area vias/via stubs, then an impedance depression on the transmission line caused by capacitive discontinuity between adjacent vias/via stubs may be too small to resolve on a TDR device. In another example implementation, a statistically relevant number (e.g., in a range of about "10" to about "30") of test area vias/via stubs may be provided so that an edge rate of a TDR device may resolve any impedance discontinuity along the transmission line. If a particular test area via stub is not properly formed, the particular via/via stub capacitance may excessively lower the impedance of the transmission line (e.g., that may be observed by the TDR device). If a particular test area via stub is properly formed, the particular via/via stub capacitance may appropriately lower the impedance of the transmission line.

The via stubs of the test area may be formed (e.g., drilled) as a last step during a fabrication process of the PCB (e.g., after formation of functional via stubs of the PCB) or prior to changing a drill bit (or other via stub formation mechanism). This may increase the chances of discovering a worn drill bit (or other via stub formation mechanism), which may not be discovered if the test area via stubs are drilled first in the fabrication process.

The term "component," as used herein, is intended to be broadly construed to include hardware (e.g., a processor, a microprocessor, an application-specific integrated circuit (ASIC), a field-programmable gate array (FPGA), a chip, a memory device (e.g., a read only memory (ROM), a random access memory (RAM), etc.), etc.) or a combination of hardware and software (e.g., a processor, microprocessor, ASIC, etc. executing software contained in a memory device).

FIG. 1 is a diagram of an example environment 100 in which systems and/or methods described herein may be implemented. As illustrated, environment 100 may include a time domain reflectometer (TDR) device 110, a printed circuit board (PCB) 120 with a test area 125, and a computing device 130. Components of environment 100 may interconnect via wired and/or wireless connections or links. A single TDR device 110, PCB 120, test area 125, and computing device 130 have been illustrated in FIG. 1 for simplicity. In practice, there may be more TDR devices 110, PCBs 120, test areas 125, and/or computing devices 130. Also, in some instances, one or more of the components of environment 100 may perform one or more tasks described as being performed by another one or more of the components of environment 100.

TDR device 110 may include an electronic instrument to characterize and locate faults in conductive transmission mechanisms (e.g., twisted wire pairs, coaxial cables, etc.), and to locate discontinuities in a connector, a PCB, a via, or any other electrical path. In one example implementation, TDR device 110 may transmit a short rise time pulse along a conductor (e.g., a transmission line of test area 125). If the conductor has a uniform impedance and is properly terminated, the transmitted pulse may be absorbed in a far-end termination and no signal may be reflected toward TDR device 110. However, any impedance discontinuities in the conductor may cause some of the transmitted pulse to be reflected back towards TDR device 110. Increases in impedance may create a reflection that reinforces the transmitted pulse, while decreases in impedance may create a reflection that opposes the transmitted pulse. TDR device 110 may measure the resulting reflected pulse, and may display or graph the reflected pulse as a function of time.

In one example implementation, TDR device 110 may provide a test signal to test area 125 of PCB 120, and may receive a reflected signal from each via provided in test area 125. TDR device 110 may compare the reflected signal from each via to a minimum impedance threshold (e.g., that provides an indication of an improperly formed via stub). If one or more of the reflected signals are not less than the minimum impedance threshold, TDR device 110 may provide (e.g., for display to a user) an indication of a passing PCB 120 (or a mechanism used to form the via stubs). If one or more of the reflected signals are less than the minimum impedance threshold, TDR device 110 may provide (e.g., for display to a user) an indication of a failing PCB 120 (or the mechanism used to form the via stubs).

In one implementation, TDR device 110 may be replaced with a vector network analyzer (VNA) with frequency to time conversation capabilities (e.g., which may be performed in software), or other similar types of lab equipment.

PCB 120 may include a mechanism to mechanically support and electrically connect electronic components using conductive wiring, pathways, or signal traces etched from copper sheets laminated onto a non-conductive substrate. PCB 120 may be a variety of sizes and shapes depending upon its use in a device, and/or the size of the device (e.g., PCB 120 may be larger in a personal computer than in a mobile phone). PCB 120 may be made from a variety of materials, including any of the materials used to make existing PCBs. Although FIG. 1 shows what is termed a "printed circuit board," in one example implementation, PCB 120 may be replaced with any electronics-based substrate, such as, for example, rigid-flex circuits, semiconductor packages, multichip carrier modules (MCMs), micro electro mechanical systems (MEMS), ceramic circuits, midplanes, backplanes, and/or other types of substrates. Further details of PCB 120 are provided below in connection with, for example, one or more of FIGS. 3A and 3B.

Test area 125 may include a number of vias and via stubs provided on PCB 120 to enable an electrical test of the vias/via stubs. In one example implementation, test area 125 may include a number of uniformly spaced vias/via stubs provided along a controlled impedance transmission line (or trace). If a particular test area 125 via stub is not properly formed, the particular via/via stub capacitance may excessively lower the impedance of the transmission line (e.g., as measured by TDR device 110). If a particular test area 125 via stub is properly formed, the particular via/via stub capacitance may appropriately lower the impedance of the transmission line (e.g., as measured by TDR device 110). The via stubs of test area 125 may be formed (e.g., drilled) as a last step during a fabrication process of PCB 120 (e.g., after formation of functional via stubs of PCB 120) or prior to changing a drill bit (or other via stub formation mechanism). This may increase the chances of discovering a worn drill bit (or other via stub formation mechanism), which may not be discovered if test area 125 via stubs are drilled first in the fabrication process.

Computing device 130 may include one or more computation or communication devices, that gather, process, and/or provide information in a manner described herein. In one example, computing device 130 may include a server device, a laptop computer, a personal computer, a workstation computer, etc. Computing device 130 may include software that, when executed by hardware components of computing device 130, enables computing device 130 to control the operation of TDR device 110 (e.g., control a signal transmitted by TDR device 110 to test area 125); to receive measurement information from TDR device 110 (e.g., reflected signals from test area 125); to output (e.g., display) the measurement information received from TDR device 110; to provide an indication (e.g., based on the measurement information) of whether PCB 120 (or the mechanism used to form the via stubs of test area 125) is functional; etc.

Although FIG. 1 shows an example of components of environment 100, in other implementations, environment 100 may contain fewer components, different components, differently arranged components, or additional components than depicted in FIG. 1. For example, in one implementation, computing device 130 may omitted and the functions of computing device 130 may performed by TDR device 110.

FIG. 2 is a diagram of example components of a device 200 that may correspond to one of the devices of environment 100. As illustrated, device 200 may include a bus 210, a processing unit 220, a memory 230, an input device 240, an output device 250, and a communication interface 260.

Bus 210 may permit communication among the components of device 200. Processing unit 220 may include one or more processors or microprocessors that interpret and execute instructions. In other implementations, processing unit 220 may be implemented as or include one or more ASICs, FPGAs, or the like.

Memory 230 may include a RAM or another type of dynamic storage device that stores information and instructions for execution by processing unit 220, a ROM or another type of static storage device that stores static information and instructions for the processing unit 220, and/or some other type of magnetic or optical recording medium and its corresponding drive for storing information and/or instructions.

Input device 240 may include a device that permits an operator to input information to device 200, such as a keyboard, a keypad, a mouse, a pen, a microphone, one or more biometric mechanisms, and the like. Output device 250 may include a device that outputs information to the operator, such as a display, a speaker, etc.

Communication interface 260 may include any transceiver-like mechanism that enables device 200 to communicate with other devices and/or systems. For example, communication interface 260 may include mechanisms for communicating with other devices, such as other devices of environment 100.

As described herein, device 200 may perform certain operations in response to processing unit 220 executing software instructions contained in a computer-readable medium, such as memory 230. A computer-readable medium may be defined as a non-transitory memory device. A memory device may include space within a single physical memory device or spread across multiple physical memory devices. The software instructions may be read into memory 230 from another computer-readable medium or from another device via communication interface 260. The software instructions contained in memory 230 may cause processing unit 220 to perform processes described herein. Alternatively, hardwired circuitry may be used in place of or in combination with software instructions to implement processes described herein. Thus, implementations described herein are not limited to any specific combination of hardware circuitry and software.

Although FIG. 2 shows example components of device 200, in other implementations, device 200 may contain fewer components, different components, differently arranged components, or additional components than depicted in FIG. 2. Alternatively, or additionally, one or more components of device 200 may perform one or more other tasks described as being performed by one or more other components of device 200.

FIG. 3A is a diagram (e.g., a top or bottom plan view) of example components of PCB 120 and its associated test area 125. PCB 120 and test area 125 may include the features described above in connection with, for example, one or more of FIGS. 1 and 2. As shown in FIG. 3A, PCB 120 may include a number functional vias 300 (e.g., individually designated as a via 305), and may provide test area 125 at a portion (e.g., on a side portion or a panel portion) of PCB 120. As further shown in FIG. 3A, test area 125 may include a number of test vias 310.

Each of functional vias 300/305 may include vias that enable PCB 120 to perform functions for which PCB 120 is designed. Each of functional vias 300/305 may include a vertical electrical connection between different layers of conductors in PCB 120. Functional vias 300/305 may include pads with plated holes that provide electrical connections between transmission lines on different layers of PCB 120. Functional vias 300/305 may be made conductive by electroplating, by filling them with annular rings or small rivets, etc. PCB 120 may include any number of functional vias 300/305, depending upon the functions for which PCB 120 is designed.

Each of test vias 310 may include vias that do not provide functionality to PCB 120, but rather enable TDR device 110 to test the formation of via stubs for functional vias 300/305 (e.g., and to test the effectiveness of the mechanism used to form the via stubs). Each of test vias 310 may include a vertical electrical connection between different layers of conductors in PCB 120. Test vias 310 may include pads with plated holes that provide electrical connections between transmission lines on different layers of PCB 120. Test vias 310 may be made conductive by electroplating, by filling them with annular rings or small rivets, etc. In one example implementation, test vias 310 may be made in a same or similar manner as functional vias 305/310 (i.e., by drilling test vias 305/310, electroplating barrels of test vias 305/310, and back drilling to an appropriate depth, using the same pad size, annular ring, and anti-pad).

In one example implementation, test vias 310 may be uniformly spaced. For example, the test vias 310 may be uniformly spaced a distance in a range of about one (1) mm to about "250" mm, depending on the overall thickness of PCB 120 and an edge rate of TDR device 110. For example, thinner PCBs 120 may support smaller test via spacing (e.g., 1 mm), and thicker PCBs 120 may support larger test via spacing (e.g., 250 mm). TDR device 110 may include, for example, a usable rise time of about "100" picoseconds (ps) after a signal is launched into PCB 120. A TDR device 110 edge rate of "100" ps may resolve a via spacing of "250" mm in a standard PCB dielectric material. The edge rate of TDR device 110 may be scaled for different PCB (or other substrate) dielectric materials, different substrate thicknesses, and different TDR device 110 rise times.

The spacing between test vias 310 may large enough so that adjacent test vias 310 may not contact one another. The spacing between test vias 310 may be small enough so that an impedance depression on the transmission line caused by capacitive discontinuity between adjacent test vias 310 is not too small to resolve on TDR device 110. In another example implementation, a statistically relevant number (e.g., in a range of about "10" to about "30") of test vias 310 may be provided in test area 125 so that an edge rate of TDR device 110 may resolve any impedance discontinuity along the transmission line.

FIG. 3B is a partial cross-sectional view, taken along line A-A of FIG. 3A, of PCB 120. As shown in FIG. 3B, the partial cross-sectional view of PCB 120 may include two functional vias 305 and one test via 310. Functional vias 305 and test via 310 may include the features described above in connection with, for example, FIG. 3A.

As further shown in FIG. 3B, PCB 120 may include multiple layers 315-1 through 315-10 (collectively referred to herein as "layers 315," or, in some instances, singularly as "layer 315"). Although ten layers 315 are shown in FIG. 3B, for example purposes, PCB 120 may include any number of layers 315, depending upon the functions for which PCB 120 is designed. Layer 315 may include one or two sheets of conductive material (e.g., copper) that are bonded to an insulating material (e.g., a FR-4 glass reinforced epoxy laminate sheet).

As also shown in FIG. 3B, a conductive material (e.g., metal) 320 may be provided in functional vias 305 and test via 310, and transmission lines (e.g., conductive traces) 325 may be provided at various layers 315 of PCB 120. For example, transmission lines 325 may be provided at layers 315-5 and 315-6, respectively, for functional vias 305, and at layer 315-1 for test via 310. During formation of PCB 120, conductive material 320 may be provided entirely through functional vias 305 and test via 310 (e.g., from layer 315-1 through layer 315-10). However, conductive material 320 may only be needed up to certain layers of functional vias 305 and test via 310. Thus, portions of conductive material 320 may be removed from functional vias 305 and test via 310. For example, conductive material 320 may be removed from the left-most functional via 305, up to layer 315-5, to form a via stub 330 for the left-most functional via 305; conductive material 320 may be removed from the other functional via 305, up to layer 315-6, to form via stub 330 for the other functional via 305; and conductive material 320 may be removed from the test via 310, up to layer 315-5, to form via stub 330 for test via 310.

Via stubs 330 may be created with a via stub creation mechanism 335, such as a mechanical drill bit, a laser or optical drill, a chemical etch, etc. Ideally, via stub creation mechanism 335 may effectively remove all of conductive material 320 from via stubs 330. However, via stub creation mechanism 335 may become worn (e.g., for the mechanical drill bit), less powerful (e.g., for the laser/optical drill and the chemical etch), and may not completely remove conductive material 320 from via stubs 330. Alternatively, or additionally, via stub creation mechanism 335 may not be properly aligned with functional vias 305 and test via 310, and may not completely remove conductive material 320 from via stubs 330. Further details of such problems are provided below in connection with, for example, FIG. 6. In one example implementation, TDR device 110 and/or computing device 130 may be utilized to determine whether via stub creation mechanism 335 effectively removes conductive material 320 from via stubs 330.

Although FIGS. 3A and 3B show example components of PCB 120, in other implementations, PCB 120 may contain fewer components, different components, differently arranged components, or additional components than depicted in FIGS. 3A and 3B. For example, PCB 120 may include electrical components (e.g., contacts, traces, capacitors, resistors, inductors, varistors, diodes, transistors, oscillators, resonators, relays, etc.) not shown in FIGS. 3A and 3B. Alternatively, or additionally, one or more components of PCB 120 may perform one or more other tasks described as being performed by one or more other components of PCB 120.

FIG. 4 is a diagram of example operations capable of being performed by environment 100. As shown, environment 100 may include TDR device 110, PCB 120, test area 125, and computing device 130. TDR device 110, PCB 120, test area 125, and computing device 130 may include the features described above in connection with, for example, one or more of FIGS. 1-3B.

As further shown in FIG. 4, TDR device 110 may provide a test signal 400 to test area 125 of PCB 120. Test signal 400 may include a short rise time pulse provided along a conductor (e.g., transmission line 325 (FIG. 3) of test area 125). Transmission line 325 of test area 125 may receive test signal 400, and may provide test signal 400 to each of test vias 310 (FIG. 3). Any impedance discontinuities in transmission line 325 (e.g., caused by transmission line 325 and/or test vias 310) may cause some of test signal 400 to be reflected back towards TDR device 110, as reflected signals 410. TDR device 110 may receive a reflected signal 410 from each test via 310 provided in test area 125. TDR device 110 may compare reflected signals 410 from test vias 310 to a minimum impedance threshold (e.g., that provides an indication of an improperly formed via stub 330).

If one or more of reflected signals 410 are not less than the minimum impedance threshold, TDR device 110 may provide (e.g., for display to a user) an indication of a passing PCB 120 (or via stub creation mechanism 335, FIG. 3). If one or more of reflected signals 410 are less than the minimum impedance threshold, TDR device 110 may provide (e.g., for display to a user) an indication of a failing PCB 120 (or via stub creation mechanism 335). For example, as shown in FIG. 4, TDR device 110 may display an output 420 (e.g., a graph) of reflected signals 410. Output 420 may provide a visual indication of whether via stub creation mechanism 335 effectively removed conductive material 320 from via stubs 330 of test vias 310. Further details of output 420 are provided below in connection with, for example, FIGS. 7A and 7B.

Computing device 130 may communicate (and/or control) TDR device 110 during performance of the analysis of test area 125. For example, computing device 130 may instruct TDR device 110 to provide test signal 400 to test area 125, and may receive reflected signals 410 from TDR device 110. Computing device 130 may compare reflected signals 410 from test vias 310 to the minimum impedance threshold. If one or more of reflected signals 410 are not less than the minimum impedance threshold, computing device 130 may provide (e.g., for display to a user) an indication of a passing PCB 120 (or via stub creation mechanism 335). If one or more of reflected signals 410 are less than the minimum impedance threshold, computing device 130 may provide (e.g., for display to a user) an indication of a failing PCB 120 (or via stub creation mechanism 335).

For example, as shown in FIG. 4, computing device 130 may display an output 430 that provides a visual indication (e.g., "Pass" or "Fail") of whether via stub creation mechanism 335 effectively removed conductive material 320 from via stubs 330 of test vias 310. Alternatively, or additionally, computing device 130 may display an output 440 that provides a visual representation of test vias 310/via stubs 330 and indicates whether test vias 310/via stubs 330 are "Good" (i.e., via stub creation mechanism 335 effectively removed conductive material 320) or "Bad" (i.e., via stub creation mechanism 335 failed to remove all of conductive material 320).

Although FIG. 4 shows example operations capable of being performed by environment 100, in other implementations, environment 100 may perform less operations, different operations, or additional operations than depicted in FIG. 4.

FIG. 5 is a diagram of example components of test area 125 of PCB 120. As shown, test area 125 may include a connector 500 connected to transmission line 325, and a number (N) 510 of uniformly spaced test vias 310 (e.g., where each test via 310 includes conductive material 320 and via stub 330) connected to transmission line 325. As further shown, test vias 310 may be spaced apart by a particular spacing 520. Test vias 310, conductive material 320, transmission line 325, and via stubs 330 may include the features described above in connection with, for example, one or more of FIGS. 3A-4.

Connector 500 may include any connector that enables test area 125 to be electrically coupled to TDR device 110. For example, connector 500 may include a coaxial connector, a standard connector (SC), a ferrule connector (FC), a sub miniature A (SMA) connector, etc. As shown in FIG. 5, connector 500 may receive test signal 400 (e.g., from TDR device 110), and may provide test signal 400 to transmission line 325. Connector 500 may receive reflected signals 410 from transmission line 325, and may provide reflected signals 410 to TDR device 110. In one example, connector 500 may include any high speed connector that can support a clean TDR edge rate launch, such as a SMA connector, a subminiature B (SMB) connector, a SMC connector, a nano-hex connector, a micro-miniature coaxial (MMPX) connector, a SMP connector, a SSMP connector, etc. In another example, a layout of the launch of connector 500 may be optimized for "50" Ohms to minimize insertion loss.

Number (N) 510 may include a statistically relevant number of test vias 310 so that an edge rate of TDR device 110 may resolve any impedance discontinuity along transmission line 325. For example, in one implementation, number 510 may be in a range of about "10" to about "30."

In one example implementation, spacing 520 between test vias 310 may be uniform. In other implementations, spacing 520 may be non-uniform. Spacing 520 may large enough so that adjacent test vias 310 may not contact one another, and may be small enough so that an impedance depression on transmission line 325 caused by capacitive discontinuity between adjacent test vias 310 is not too small to resolve on TDR device 110. In one example, spacing 520 may include a distance in a range of about "1" mm to about "250" mm.

Test signal 400 may travel along transmission line 325 and down each test via 310. Conductive material 320 of test vias 310 may lower the impedance of test signal 400 to produce reflected signals 410. If via stubs 330 are formed properly (e.g., with no conductive material 320), conductive material 320 of test vias 310 may lower the impedance of test signal 400 about the same amount. In other words, reflected signal 410 from each test via 310 may be approximately the same if via stubs 330 are formed properly. However, if one or more particular via stubs 330 are improperly formed, test vias 310 corresponding to the one or more particular via stubs 330 may significantly lower the impedance of test signal 400 (e.g., more so than test vias 310 with properly formed via stubs 330).

For example, FIG. 6 is a diagram 600 showing example problems that may occur due to improper removal of conductive material 320 from test vias 310 of PCB 120. As shown to the left in FIG. 6, test via 310 may include conductive material 320 and via stub 330. However, via stub 330 may include metal slivers 610 due to improper removal of conductive material 320 from via stub 330 (e.g., due to a worn drill bit). As shown to the right in FIG. 6, test via 310 may include conductive material 320 and a misaligned via stub 620 (e.g., caused by a misaligned via stub creation mechanism 335, FIG. 3B). Misaligned via stub 620 may include a remaining via stub 630 of conductive material 320. Metal slivers 610 and/or remaining via stub 630 may significantly lower the impedance of test signal 400 (e.g., more so than test vias 310 with properly formed via stubs 330).

Although FIG. 6 shows example problems that may occur due to improper removal of conductive material 320 from test vias 310 of PCB 120, in other implementations, PCB 120 may contain fewer problems, different problems, or additional problems than depicted in FIG. 6.

Returning to FIG. 5, reflected signals 410 from test vias 310 may travel from transmission line 325 to connector 500 and ultimately to TDR device 110, not shown. TDR device 110 may display reflected signals 410. For example, TDR device 110 may display reflected signals 410 as measurement results depicted in FIG. 7A or FIG. 7B.

FIG. 7A is a diagram of example measurement results 700 associated with a properly formed test area 125 of PCB 120 (e.g., that may be displayed by TDR device 110 and/or computing device 130). As shown in FIG. 7A, measurement results 700 may include a graph of reflected signals (e.g., reflected signals 410) plotted according to impedance (e.g., in Ohms) versus time. In one example, TDR device 110 may experience a drop in impedance (e.g., from about "50" Ohms to about "15" Ohms) when TDR device 110 is connected to connector 500 (FIG. 5), as indicated by reference number 710. As further shown in FIG. 7A, transmission line 325 may generate almost constant impedance measurements of about "50" Ohms, as indicated by reference number 720. Test area 125 (e.g., when via stubs 330 are properly formed) may generate almost constant impedance measurements of about "30" Ohms, as indicated by reference number 730. Test area measurements 730 may be above a minimum impedance threshold 740 (e.g., of "20" Ohms), which may indicate that via stubs 330 of test area 125 are properly formed. In one example implementation, an impedance depression (Z') or lowering (e.g., as shown in test area measurements 730), due to capacitive test vias 310 of test area 125, may be calculated according to the following equation:

$$Z' = \frac{Z0}{\sqrt{\frac{1+CL/D}{Cll}}},$$

where "Z0" may include an intrinsic impedance of transmission line 325 without test vias 310, "CL" may include a lumped capacitance of a test via 310, "D" may include a distance (or spacing) between adjacent test vias 310, and "Cll" may include a self capacitance of transmission line 325 per unit length.

FIG. 7B is a diagram of example measurement results 700 associated with an improperly formed test area 125 of PCB 120 (e.g., that may be displayed by TDR device 110 and/or computing device 130). As shown in FIG. 7B, measurement results 700 may include a graph of reflected signals (e.g., reflected signals 410) plotted according to impedance versus time. TDR device 110 may experience a drop in impedance when TDR device 110 is connected to connector 500, as indicated by reference number 710. As further shown in FIG. 7B, transmission line 325 may generate almost constant impedance measurements of about "50" Ohms, as indicated by reference number 720. Test area 125 may generate almost constant impedance measurements of about "30" Ohms (e.g., except for one impedance measurement), as indicated by reference number 730. Most of test area measurements 730 may be above minimum impedance threshold 740 (e.g., of "20" Ohms), which may indicate that most via stubs 330 of test area 125 are properly formed. However, one test area measurement 730 may be below minimum impedance threshold 740, which may indicate a bad via stub 750 (e.g., an improperly formed via stub 330) of test area 125.

Although FIGS. 7A and 7B show example information of measurement results 700, in other implementations, measurement results 700 may contain less information, different information, differently arranged information, or additional information than depicted in FIGS. 7A and 7B.

Although FIG. 5 shows example components of test area 125, in other implementations, test area 125 may contain fewer components, different components, differently arranged components, or additional components than depicted in FIG. 5. Alternatively, or additionally, one or more components of test area 125 may perform one or more other tasks described as being performed by one or more other components of test area 125.

FIG. 8 is a flow chart of an example process 800 for testing vias formed in printed circuit boards according to implementations described herein. In one implementation, process 800 may be performed by TDR device 110. In another implementation, some or all of process 800 may be performed by another device or group of devices (e.g., computing device 130), including or excluding TDR device 110.

As illustrated in FIG. 8, process 800 may include providing a test signal to a via test area of a PCB (block 810), and receiving a reflected signal from each via in the via test area of the PCB (block 820). For example, in implementations described above in connection with FIG. 4, TDR device 110 may provide test signal 400 to test area 125 of PCB 120. Test signal 400 may include a short rise time pulse provided along a conductor (e.g., transmission line 325 of test area 125). Transmission line 325 of test area 125 may receive test signal 400, and may provide test signal 400 to each of test vias 310. Any impedance discontinuities in transmission line 325 (e.g., caused by transmission line 325 and/or test vias 310) may cause some of test signal 400 to be reflected back towards TDR device 110, as reflected signals 410. TDR device 110 may receive a reflected signal 410 from each test via 310 provided in test area 125.

As further shown in FIG. 8, process 800 may include comparing the reflected signal from each via to a minimum impedance threshold (block 830). If the reflected signal(s) are not less than the minimum impedance threshold (block 840— NO), process 800 may include providing for display an indication of a passing PCB and/or via stub creation mechanism (block 850). For example, in implementations described above in connection with FIG. 4, TDR device 110 may compare reflected signals 410 from test vias 310 to a minimum impedance threshold (e.g., that provides an indication of an improperly formed via stub 330). If one or more of reflected signals 410 are not less than the minimum impedance threshold, TDR device 110 may provide (e.g., for display to a user) an indication of a passing PCB 120 (or via stub creation mechanism 335, FIG. 3). In one example, TDR device 110 may display output 420 (e.g., a graph) of reflected signals 410. Output 420 may provide a visual indication of whether via stub creation mechanism 335 effectively removed conductive material 320 from via stubs 330 of test vias 310.

Returning to FIG. 8, if the reflected signal(s) are less than the minimum impedance threshold (block 840—YES), process 800 may include providing for display an indication of a failing PCB and/or via stub creation mechanism (block 860). For example, in implementations described above in connection with FIG. 4, if one or more of reflected signals 410 are less than the minimum impedance threshold, TDR device 110 may provide (e.g., for display to a user) an indication of a failing PCB 120 (or via stub creation mechanism 335). In one example, TDR device 110 may display output 420 (e.g., a graph) of reflected signals 410. Output 420 may provide a visual indication of whether via stub creation mechanism 335 effectively removed conductive material 320 from via stubs 330 of test vias 310.

Systems and/or methods described herein may provide a test area (e.g., of vias and via stubs) on a PCB (e.g., on a PCB panel or a side of the PCB) that enables an electrical test of the PCB vias/via stubs. The systems and/or methods may be more effective than manual inspection of via stubs, and may prevent costly yield losses of PCBs. In one example implementation, a TDR measurement of the test area may be performed. The TDR measurement may show whether conductive material is effectively removed from the vias to create the via stubs in the PCB. If the conductive material is effectively removed, the TDR measurement results may show a constant impedance (or a small impedance depression depending upon layers of the PCB) versus length (i.e., a passing criteria for the PCB). If the conductive material is not effectively removed, the TDR measurement results may show a significant impedance depression that is below a minimum impedance threshold (e.g., a passing impedance tolerance).

The foregoing description of implementations provides illustration and description, but is not intended to be exhaustive or to limit the invention to the precise form disclosed. Modifications and variations are possible in light of the above teachings or may be acquired from practice of the invention.

For example, while a series of blocks has been described with regard to FIG. 8, the order of the blocks may be modified in other implementations. Further, non-dependent blocks may be performed in parallel.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Even though particular combinations of features are recited in the claims and/or disclosed in the specification, these combinations are not intended to limit the disclosure of the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method implemented by a device, the method comprising:
   providing, by the device, a time domain reflectometry (TDR) or a vector network analyzer (VNA) test signal to a via test area provided on a printed circuit board (PCB);
   receiving, by the device, a reflected signal from each via in the via test area of the PCB;
   comparing, by the device, the reflected signal from each via to a minimum impedance threshold; and
   providing, by the device and for display, an indication of passing for the PCB, when the reflected signals from the vias are greater than the minimum impedance threshold.

2. The method of claim 1, further comprising:
   providing, for display, an indication of passing for a mechanism used to create via stubs for the vias, when the reflected signals from the vias are greater than the minimum impedance threshold.

3. The method of claim 1, further comprising:
   providing, for display, an indication of failing for the PCB, when at least one of the reflected signals from the vias is less than the minimum impedance threshold.

4. The method of claim 1, further comprising:
   providing, for display, an indication of failing for a mechanism used to create via stubs for the vias, when at least one of the reflected signals from the vias is less than the minimum impedance threshold.

5. The method of claim 1, where the device comprises one of a computing device or a time domain reflectometer.

6. The method of claim 1, where the via test area is created last during fabrication of the PCB and in a similar manner as functional vias of the PCB.

7. The method of claim 1, where the via test area includes a number of spaced vias provided along a controlled impedance transmission line.

8. The method of claim 7, where the number of vias is in a range from about ten vias to about thirty vias.

9. The method of claim 7, where the vias are spaced a distance in a range of about one millimeters to about 250 millimeters.

10. A device, comprising:
    a memory to store a plurality of instructions; and
    a processor to execute instructions in the memory to:
        provide a time domain reflectometry (TDR) or a vector network analyzer (VNA) test signal to a via test area provided on a printed circuit board (PCB), where the via test area includes vias and via stubs formed in the vias,
        receive a reflected signal from each via in the via test area of the PCB,
        compare the reflected signal from each via to a minimum impedance threshold, and
        provide, for display, an indication of passing for the PCB, when the reflected signals from the vias are greater than the minimum impedance threshold.

11. The device of claim 10, where the device comprises one of a computing device or a time domain reflectometer.

12. The device of claim 10, where the processor is further to execute instructions in the memory to:
    provide, for display, an indication of passing for a mechanism used to form the via stubs in the vias, when the reflected signals from the vias are greater than the minimum impedance threshold.

13. The device of claim 12, where the mechanism includes one of a mechanical removal mechanism, an optical removal mechanism, or a chemical removal mechanism.

14. The device of claim 10, where the processor is further to execute instructions in the memory to:
    provide, for display, an indication of failing for the PCB, when at least one of the reflected signals from the vias is less than the minimum impedance threshold.

15. The device of claim 10, where the processor is further to execute instructions in the memory to:
    providing, for display, an indication of failing for a mechanism used to form the via stubs in the vias, when at least one of the reflected signals from the vias is less than the minimum impedance threshold.

16. The device of claim 10, where the via test area is created last during fabrication of the PCB.

17. The device of claim 10, where the via test area includes a number of spaced vias provided along a controlled impedance transmission line.

18. The device of claim 17, where the number of vias is in a range from about ten vias to about thirty vias.

19. The device of claim 17, where the vias are spaced a distance in a range of about one millimeter to about 250 millimeters.

20. One or more non-transitory computer-readable media storing instructions executable by one or more processors, the media storing one or more instructions for:
    providing a time domain reflectometry (TDR) or a vector network analyzer (VNA) test signal to a via test area provided on a substrate;
    receiving a reflected signal from each via in the via test area of the substrate;
    comparing the reflected signal from each via to a minimum impedance threshold;
    providing, for display, an indication of passing for the substrate or for a mechanism used to create via stubs for the vias, when the reflected signals from the vias are greater than the minimum impedance threshold; and
    providing, for display, an indication of failing for the substrate or for the mechanism used to create via stubs for the vias, when at least one of the reflected signals from the vias is less than the minimum impedance threshold.

* * * * *